United States Patent
Park

(10) Patent No.: US 11,074,977 B2
(45) Date of Patent: Jul. 27, 2021

(54) THREE-DIMENSIONAL NON-VOLATILE MEMORY DEVICE AND METHOD OF MANUFACTURING THE SAME

(71) Applicant: SK hynix Inc., Icheon-si (KR)

(72) Inventor: Eun Young Park, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/557,296

(22) Filed: Aug. 30, 2019

(65) Prior Publication Data

US 2020/0211651 A1    Jul. 2, 2020

(30) Foreign Application Priority Data

Dec. 28, 2018   (KR) .......................... 10-2018-0172231

(51) Int. Cl.
| | |
|---|---|
| *G11C 16/04* | (2006.01) |
| *G11C 16/10* | (2006.01) |
| *G11C 16/24* | (2006.01) |
| *G11C 16/34* | (2006.01) |

(52) U.S. Cl.
CPC .......... *G11C 16/10* (2013.01); *G11C 16/0483* (2013.01); *G11C 16/24* (2013.01); *G11C 16/3459* (2013.01)

(58) Field of Classification Search
CPC ..... G11C 16/10; G11C 16/24; G11C 16/3459; G11C 16/0483; G11C 16/08; G11C 7/14; H01L 27/115
See application file for complete search history.

(56) References Cited

U.S. PATENT DOCUMENTS

| | | | |
|---|---|---|---|
| 2014/0334230 A1 | 11/2014 | Kwon | |
| 2016/0141011 A1* | 5/2016 | Lee | .......... G11C 16/0483 365/201 |
| 2016/0260483 A1 | 9/2016 | Shano et al. | |
| 2017/0213843 A1* | 7/2017 | Choi | .......... H01L 28/00 |
| 2018/0218774 A1 | 8/2018 | Kimura | |
| 2020/0203180 A1 | 6/2020 | Sonehara et al. | |

FOREIGN PATENT DOCUMENTS

KR    1020130050589 A    5/2013

* cited by examiner

*Primary Examiner* — Uyen Smet
(74) *Attorney, Agent, or Firm* — William Park & Associates Ltd.

(57) ABSTRACT

A semiconductor device includes a memory block including a plurality of memory strings, each of the plurality of memory strings including one or more dummy transistors, wherein each of the dummy transistors, included in the plurality of memory strings, is programmed to different degrees according to a junction overlap of each of the memory strings.

14 Claims, 13 Drawing Sheets

THREE-DIMENSIONAL NON-VOLATILE MEMORY DEVICE AND METHOD OF MANUFACTURING THE SAME

CROSS-REFERENCE TO RELATED APPLICATION

The present application claims priority under 35 U.S.C. § 119(a) to Korean patent application number 10-2018-0172231, filed on Dec. 28, 2018, in the Korean Intellectual Property Office, the entire disclosure of which is incorporated herein by reference.

BACKGROUND

1. Technical Field

Various embodiments generally relate to a non-volatile memory device and a method of manufacturing the same, and more particularly, to a non-volatile memory device having improved operational characteristics and a method of manufacturing the non-volatile memory device.

2. Related Art

Semiconductor memory devices are storage devices made of semiconductor materials such as silicon (Si), germanium (Ge), gallium arsenide (GaAs), and indium phosphide (InP). Semiconductor memory devices are classified into volatile memory devices and nonvolatile memory devices.

Volatile memory devices lose stored data when the power is off. Examples of volatile memory devices may include Static RAM (SRAM), Dynamic RAM (DRAM) and Synchronous DRAM (SDRAM). Nonvolatile memory devices may retain stored data independent of the availability of power. Examples of nonvolatile memory devices may include Read Only Memory (ROM), Programmable ROM (PROM), Electrically Programmable ROM (EPROM), Electrically Erasable and Programmable ROM (EEPROM), flash memory, Phase-change RAM (PRAM), Magnetic RAM (MRAM), Resistive RAM (RRAM), and Ferroelectric RAM (FRAM). Flash memory may be generally classified into NOR-type memory and NAND-type memory.

During the manufacturing phase of the nonvolatile memory, the etching process may not be perfectly uniform, resulting in the varying heights of the pad. Furthermore, the diffusion of impurities from the pad to the channel layer results in differences in junction overlap. The differences in pad heights and junction overlap between memory strings lead to operational inefficiencies.

SUMMARY

According to an embodiment, a semiconductor device may include a memory block including a plurality of memory strings, each of the plurality of memory strings including one or more dummy transistors, wherein each of the dummy transistors, included in each of the plurality of memory strings, is programmed to different degrees according to a junction overlap of each of the memory strings.

According to an embodiment, a semiconductor device may include a stacked structure including word lines, at least one select line stacked over the word lines, and at least one dummy line stacked over the select line, channel layers passing through the stacked structure, and pads formed to be coupled to the channel layers, respectively, wherein dummy transistors are located at intersections of the channel layers and the dummy line, and the dummy transistors are programmed to different degrees according to a height of each of the pads.

According to an embodiment, a method of manufacturing a semiconductor device may include forming a stacked structure, forming openings passing through the stacked structure, forming channel layers in the openings, respectively, and forming pads coupled to the channel layers in the openings, wherein each of memory strings includes one or more dummy transistors, and the one or more dummy transistors are programmed to different degrees according to a height of each of the pads.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

Various embodiments are directed to a semiconductor device with improved operational characteristics, and a manufacturing method of the semiconductor device.

Hereinafter, various examples of embodiments will be described with reference to the accompanying drawings. In the following description, a detailed explanation of related functions and constitutions may be omitted for simplicity and conciseness. In addition, they may be embodied in different forms and should not be construed as limited to the embodiments set forth herein. Rather, these embodiments are provided so that this disclosure will be thorough and complete, and will fully convey the scope of the example embodiments to those skilled in the art.

In the following description, it should be noted that only a portion required to understand the operation in accordance with the present disclosure will be described, and the description of the remaining portion will be omitted to prevent from obscuring the gist of the present disclosure. The present disclosure may, however, be embodied in different forms and should not be construed as being limited to the embodiments set forth herein. Rather, these embodiments are provided to describe the present disclosure in detail to the extent that those skilled in the art to which the disclosure pertains may easily enforce the technical concept of the present disclosure.

It is also noted that in this specification, "connected/coupled" refers to one component not only "directly coupling" another component but also "indirectly coupling" another component through an intermediate component. In the specification, when an element is referred to as "comprising" or "including" a component, it does not exclude other components but may further include other components unless a description to the contrary is specifically pointed out in context.

Figure 1:
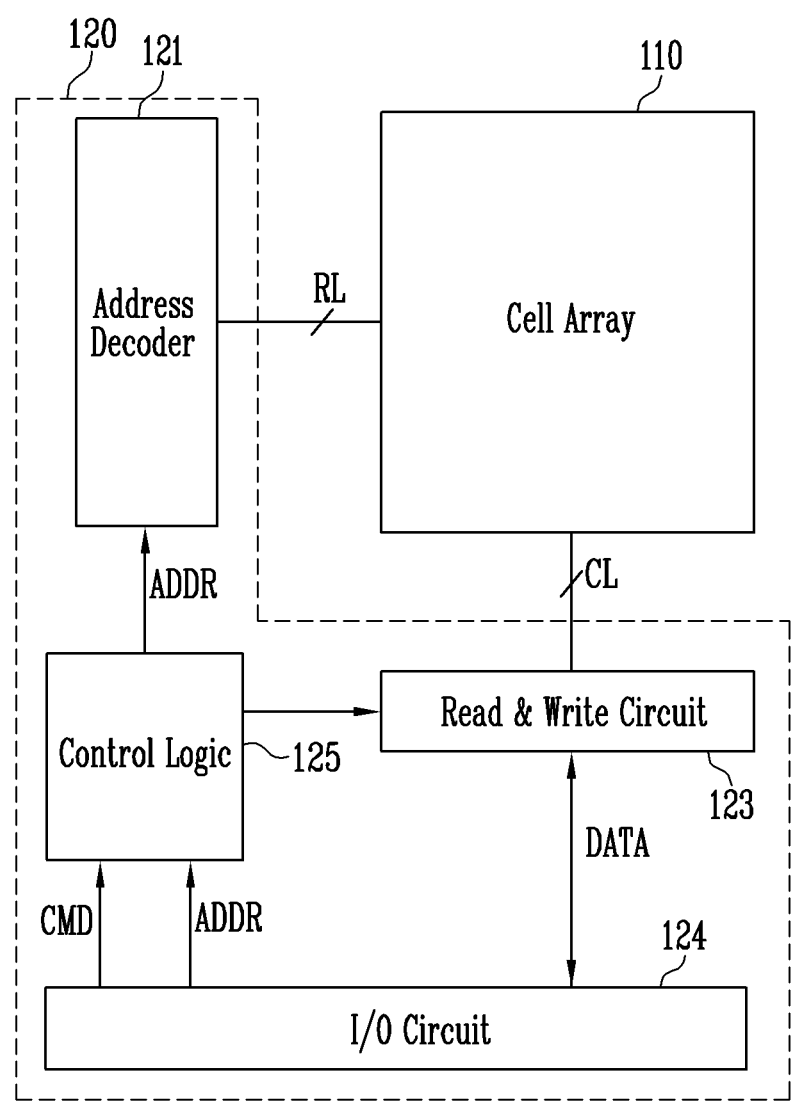
FIG. 1 is a block diagram, illustrating the configuration of a semiconductor device, according to an embodiment.

FIG. 1 is a block diagram, illustrating the configuration of a semiconductor device 100, according to an embodiment. Referring to FIG. 1, the semiconductor device 100 may include a cell array 110 and a peripheral circuit 120.

The cell array 110 may include a plurality of memory strings, and the plurality of memory strings may be arranged in a horizontal direction or a vertical direction to a substrate. In addition, the cell array 110 may include a plurality of memory blocks, and each of the plurality of memory blocks may include a plurality of pages. For example, the semiconductor device 100 may perform an erase operation in units of memory blocks and a program operation or a read operation in units of pages.

The cell array 110 may be coupled to an address decoder 121 through row lines RL and to a read and write circuit 123 through column lines CL. The row lines RL may be word lines, and the column lines CL may be bit lines. However, the terms "word lines" and "bit lines" may be relative to each other. In other words, row lines may be the bit lines, and column lines may be the word lines.

The peripheral circuit 120 may include the address decoder 121, the read and write circuit 123, an input/output circuit 124 and a control logic 125.

The control logic 125 may be coupled to the address decoder 121, the read and write circuit 123, and the input/output circuit 124. The control logic 125 may receive a command CMD and an address ADDR from the input/output circuit 124. According to the received command CMD, the control logic 125 controls the address decoder 121 and the read and write circuit 123 to perform an internal operation.

The address decoder 121 may be coupled to the cell array 110 through the row lines RL. The address decoder 121 may be coupled to the cell array 110 through the word line, a dummy line, a source select line, and a drain select line. Furthermore, according to the control logic 125, the address decoder 121 may control the row lines RL. In other words, as the address decoder 121 receives the address ADDR from the control logic 125, the address decoder 121 may decode the address ADDR and may select one of the memory blocks of the cell array 110 according to the received address ADDR.

As previously stated, the program and read operation of the semiconductor device 100 may be performed in units of pages. Therefore, for the program operation and the read operation, the address ADDR may include a block address and a row address, specifying which page is to be selected. The address decoder 121 may decode the block address, included in the received address ADDR, and select the corresponding memory blocks according to the decoded block address. The address decoder 121 may decode the row address included in the received address ADDR and select one of the pages of the selected memory block according to the decoded row address.

Furthermore, an erase operation of the semiconductor device 100 may be performed in units of memory blocks. Therefore, during the erase operation, the address ADDR may include a block address. The address decoder 121 may decode the block address and select the corresponding memory blocks according to the decoded block address.

The read and write circuit 123 may be coupled to the cell array 110 through the column lines CL. When the control logic 125 provides the signal to perform a program operation, the read and write circuit 123 may transfer data DATA received from the input/output circuit 124 to the column lines CL, and memory cells of the selected page, selected based on Address ADDR, may be programmed according to the transferred data DATA. The data DATA may be multi-bit data. In addition, the memory cells may be programmed by a Single Level Cell (SLC) method or a Multi Level Cell (MLC) method.

When the control logic 125 provides the signal to perform a read operation, the read and write circuit 123 may read the data DATA from the memory cells of the selected page, selected based on Address ADDR, through the column lines CL, and output the read data DATA to the input/output circuit 124.

Furthermore, when the control logic 125 provides the signal to perform an erase operation, the read and write circuit 123 may float the column lines CL. A program operation and an erase operation may include a verify operation, verifying how successful the program and erase operations were. The verify operation may be similarly performed to the read operation.

Figure 2A:
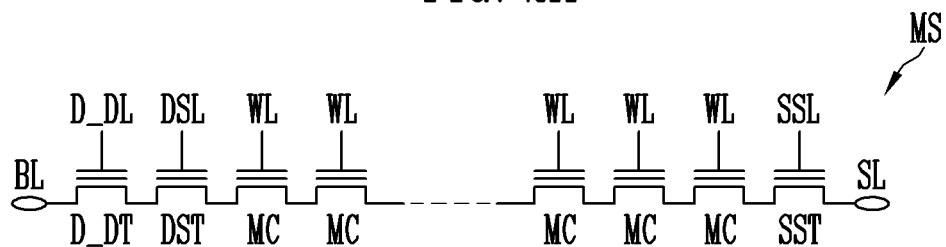
FIGS. 2A to 2C are circuit diagrams illustrating a memory string of a semiconductor device according to an embodiment.
Figure 2B:
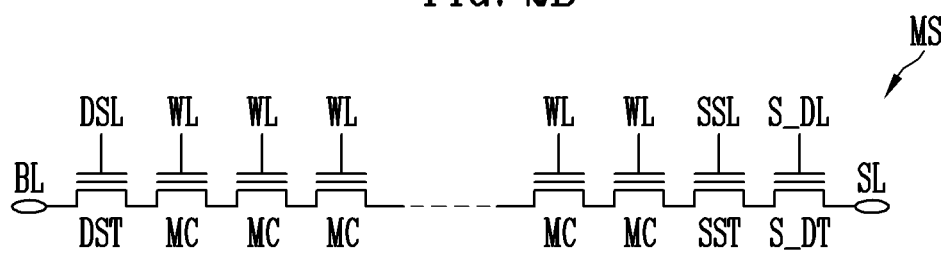
Figure 2C:
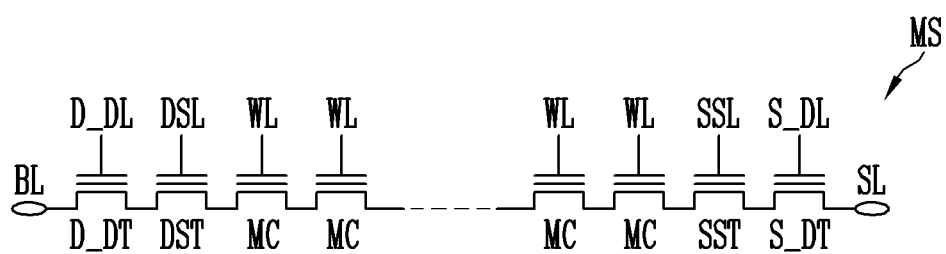

FIGS. 2A to 2C are circuit diagrams, illustrating a memory string MS of a semiconductor device, according to an embodiment.

Referring to FIGS. 2A to 2C, the memory string MS may be coupled between a bit line BL and a source line SL. The memory string MS may include at least one drain select transistor DST, a plurality of memory cells MC and at least one source select transistor SST. In addition, the memory string MS may further include one or more dummy transistors D_DT or S_DT coupled between the bit line BL and the drain select transistor DST or between the source line SL and the source select transistor SST.

Referring to FIG. 2A, the memory string MS may include the drain side dummy transistor D_DT, at least one drain select transistor DST, the plurality of memory cells MC, and at least one source select transistor SST coupled in series with each other. Referring to FIG. 2B, the memory string MS may include at least one drain select transistor DST, the plurality of memory cells MC, at least one source select transistor SST, and the source side dummy transistor S_DT coupled in series with each other. In addition, referring to FIG. 2C, the memory string MS may include the drain side dummy transistor D_DT, at least one drain select transistor DST, the plurality of memory cells MC, at least one source select transistor SST, and at least one source side dummy transistor S_DT coupled in series with each other. The number of drain side dummy transistors D_DT included in one memory string MS may be the same as or different from the number of source side dummy transistors S_DT.

A gate electrode of the memory cell MC may be coupled to a word line WL. A word line voltage (such as a program voltage, a pass voltage, and a read voltage) necessary for drive may be applied to the word line WL. A gate electrode of the drain side dummy transistor D_DT may be coupled to a drain side dummy line D_DL. A gate electrode of the source side dummy transistor S_DT may be coupled to a source side dummy line S_DL. Voltages (such as a program voltage, a pass voltage, a read voltage, and a ground voltage) necessary for drive may be applied to each of the dummy lines D_DL or S_DL. A gate electrode of the drain select transistor DST may be coupled to a drain select line DSL. A gate electrode of the source select transistor SST may be coupled to a source select line SSL.

According to the structure as described above, the drain side dummy transistor D_DT may be located between the bit line BL and the drain select transistor DST. In other words, a transistor adjacent to the bit line BL may serve as a dummy transistor. Accordingly, the drain side dummy transistor D_DT may serve as a buffer when the drain select transistor DST controls coupling between the memory string MS and the bit line BL.

The source side dummy transistor S_DT may be located between the source line SL and the source select transistor SST. In other words, a transistor adjacent to the source line SL may serve as a dummy transistor. Accordingly, the source side dummy transistor S_DT may serve as a buffer when the source select transistor SST controls coupling between the memory string MS and the source line SL.

In addition, the cell array may include a plurality of memory blocks, and each memory block may include the plurality of memory strings MS. The memory strings MS may have different physical structures such as a height of a pad and a junction overlap of a channel structure from each other. In addition, difference in electrical characteristics such as a threshold voltage may be induced by the difference in physical structure. Accordingly, an embodiment provides a measure to compensate for difference in electrical characteristics due to difference in physical structure of memory strings.

According to an embodiment, the dummy transistors D_DT/S_DT, included in each of the memory strings MS, may be programmed to different degrees. For example, the dummy transistors D_DT/S_DT may be programmed to different degrees, according to the physical structure of the memory strings MS. Accordingly, the dummy transistors D_DT/S_DT may have a uniform threshold voltage.

Thereby, operational characteristics of a semiconductor device may be improved and reliability of data may be increased.

Figure 3:
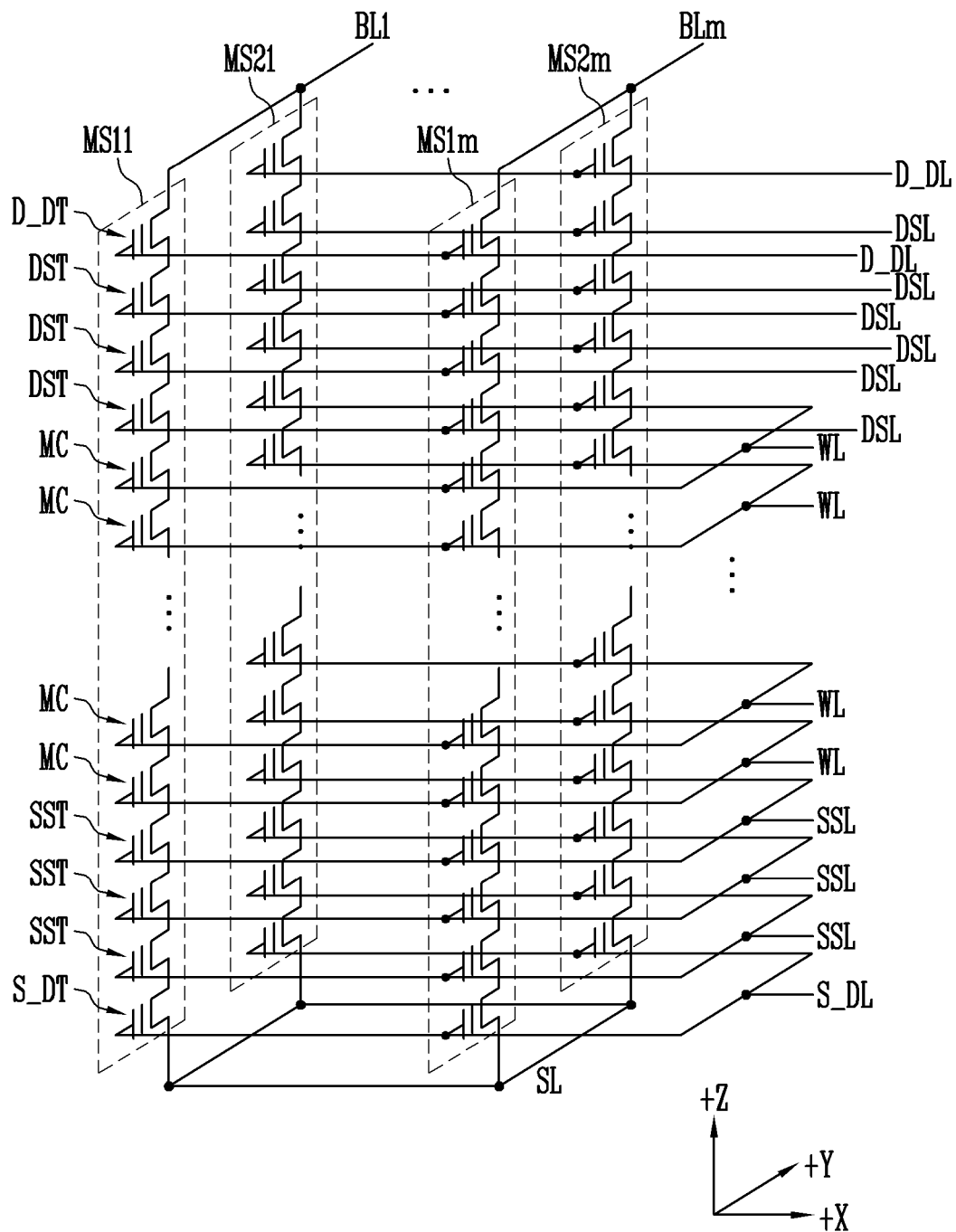
FIG. 3 illustrates an embodiment in which memory strings MS according to an embodiment are arranged in three dimensions.

FIG. 3 illustrates an embodiment in which the memory strings MS, according to an embodiment, are arranged in three dimensions. A cell array may include a plurality of memory blocks BLK, and each of the memory blocks BLK may include the memory cells MC arranged in three dimensions.

Referring to FIG. 3, the memory block BLK may include a plurality of memory strings MS11 to MS1*m* and MS21 to MS2*m* coupled between bit lines BL1 to BLm and the source line SL. Each of the memory strings MS11 to MS1*m* and MS21 to MS2*m* may extend in a +Z direction. In other words, the +Z direction may be a direction in which the memory cells MC are stacked. In turn, the +Y direction may be a direction in which the bit lines BL1 to BLm extend, and the +X direction may be a direction in which the word lines WL extend. Here, m may be an integer of 2 or more.

Each of the memory strings MS11 to MS1*m* and MS21 to MS2*m* may include at least one source select transistor SST, the plurality of memory cells MC, and at least one drain select transistor DST that are sequentially stacked. Furthermore, in an embodiment, each of the memory strings MS11 to MS1*m* and MS21 to MS2*m* may further include at least one drain side dummy transistor D_DT coupled between the bit lines BL1 to BLm and the drain select transistor DST, at least one source side dummy transistor S_DT coupled between the source line SL and the source select transistor SST, or the drain side dummy transistor D_DT and the source side dummy transistor S_DT. However, the number, the location, and the like of the dummy transistors D_DT/S_DT included in each of the memory strings MS11 to MS1*m* and MS21 to MS2*m* may be changed. For example, the number of drain side dummy transistors D_DT and the number of source side dummy transistors S_DT, included in one of the memory strings MS11 to MS1*m* and MS21 to MS2*m*, may be the same as or different from each other.

At least one source side dummy transistor S_DT included in one of the memory strings MS11 to MS1*m* and MS21 to MS2*m* may be coupled between the source select transistor SST and the source line SL in series. In addition, the source side dummy transistors S_DT which are located in the same level may be coupled to the same source side dummy line S_DL.

At least one drain side dummy transistor D_DT included in one of the memory strings MS11 to MS1*m* and MS21 to MS2*m* may be coupled between the drain select transistor DST and the bit line BL in series. In addition, the drain side dummy transistors D_DT, which are located at the same level and arranged on the same row in the +X direction, may be connected to the same drain side dummy line D_DL. Therefore, drain-side dummy transistors D_DT, located at the same level, but arranged on a different row in the +X direction, may be connected to a different drain-side dummy line D_DL.

The memory cells MC included in one of the memory strings MS11 to MS1*m* and MS21 to MS2*m* may be coupled between the source select transistor SST and the drain select transistor DST in series. In addition, the memory cells MC in the same level may be coupled to the same word line WL.

The source select transistors SST, included in one of the memory strings MS11 to MS1*m* and MS21 to MS2*m*, may be coupled between the source side dummy transistor S_DT and the memory cell MC in series. In addition, the source select transistors SST, in the same level, may be coupled to the same source select line SSL.

Likewise, the drain select transistors DST included in one of the memory strings MS11 to MS1*m* and MS21 to MS2*m* may be coupled between the drain side dummy transistor D_DT and the memory cell MC in series. Additionally, the drain select transistors DST, located at the same level and arranged in the same row in the +X direction, may be coupled to the same drain select line DSL. Therefore, the drain select transistors DST, located at the same level, but arranged on a different row in the +X direction, may be coupled to a different drain select lines DSL.

Figure 4:
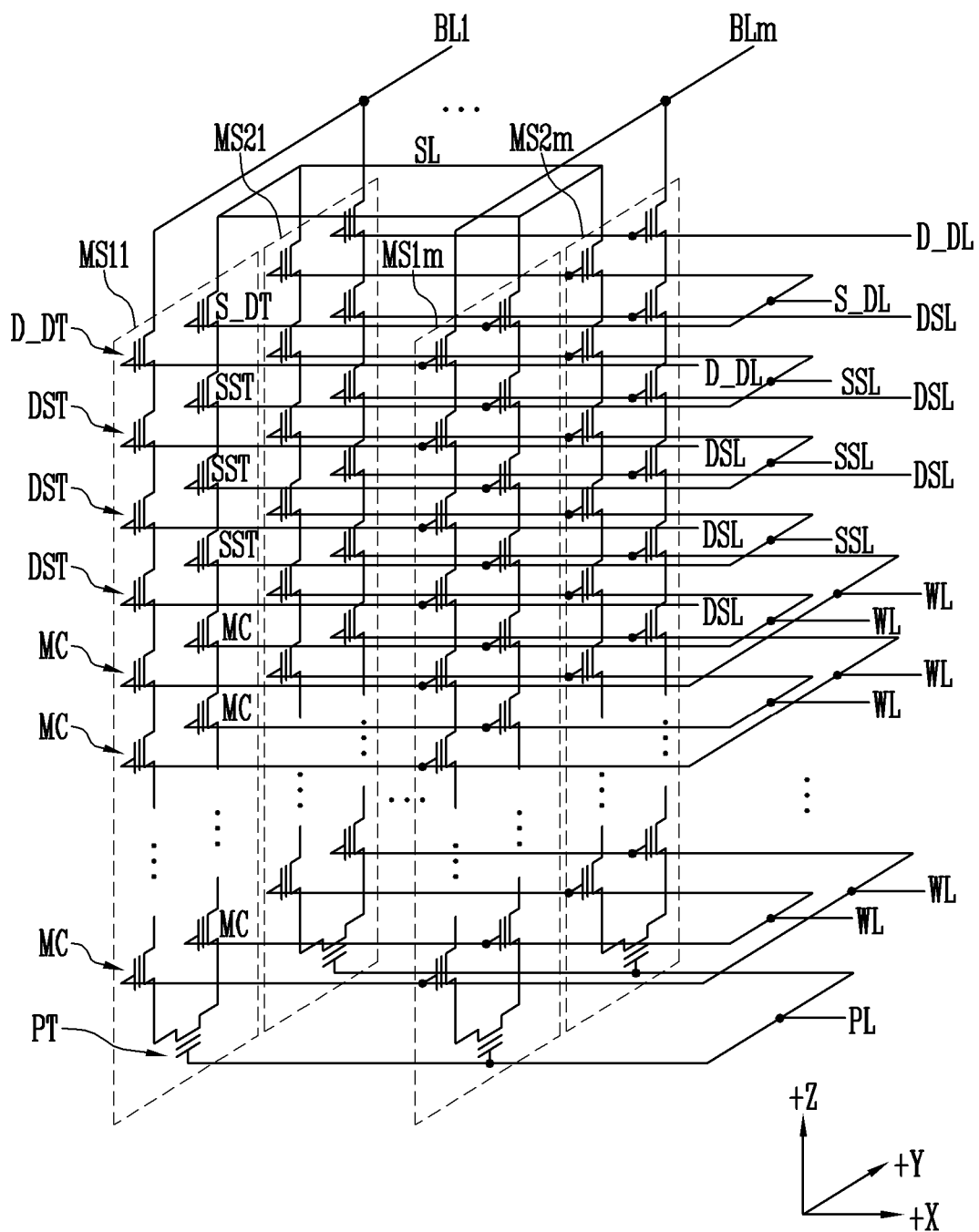
FIG. 4 illustrates an embodiment in which the memory strings MS according to an embodiment are arranged in three dimensions.

FIG. 4 illustrates an embodiment in which the memory strings MS, according to an embodiment, are arranged in three dimensions. A cell array may include the plurality of memory blocks BLK, and each of the memory blocks BLK may include the memory cells MC arranged in three dimensions.

Referring to FIG. 4, the memory block BLK may include the plurality of memory strings MS11 to MS1*m* and MS21 to MS2*m*. Each of the memory strings MS11 to MS1*m* and MS21 to MS2*m* may include at least one source side dummy transistor S_DT, at least one source select transistor SST, the plurality of memory cells MC, at least one pipe transistor PT, the plurality of memory cells MC, at least one drain select transistor DST, and at least one drain side dummy transistor D_DT, connected in series, respectively. Each of the memory strings MS11 to MS1*m* and MS21 to MS2*m* may be arranged in the shape of U, resulting in the source-side dummy transistor S_DT and source select transistor SST being located at similar levels to the drain-side dummy transistor D_DT and drain select transistor DST, respectively.

The pipe transistor PT may couple the memory cells MC of the drain side and the memory cells MC of the source side. In addition, a gate of the pipe transistor PT of each of the memory strings MS11 to MS1*m* and MS21 to MS2*m* may be coupled to a pipe line PL.

Structures, other than the structures described above with reference to FIG. 4, are similar to the structures as described with reference to FIG. 3. Therefore, repetitive descriptions are omitted herein.

Figure 5A:
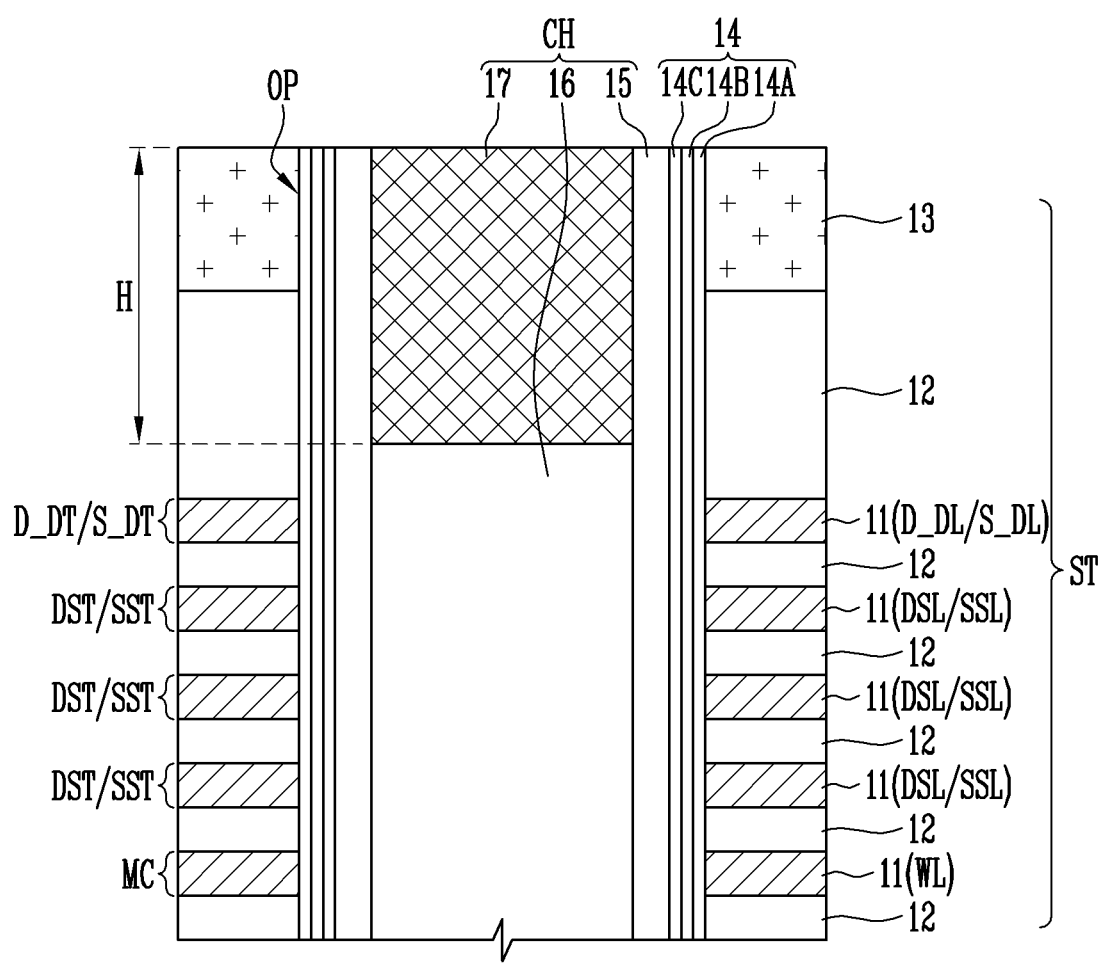
FIGS. 5A to 5C are cross-sectional diagrams illustrating the structure of a semiconductor device according to an embodiment.
Figure 5B:
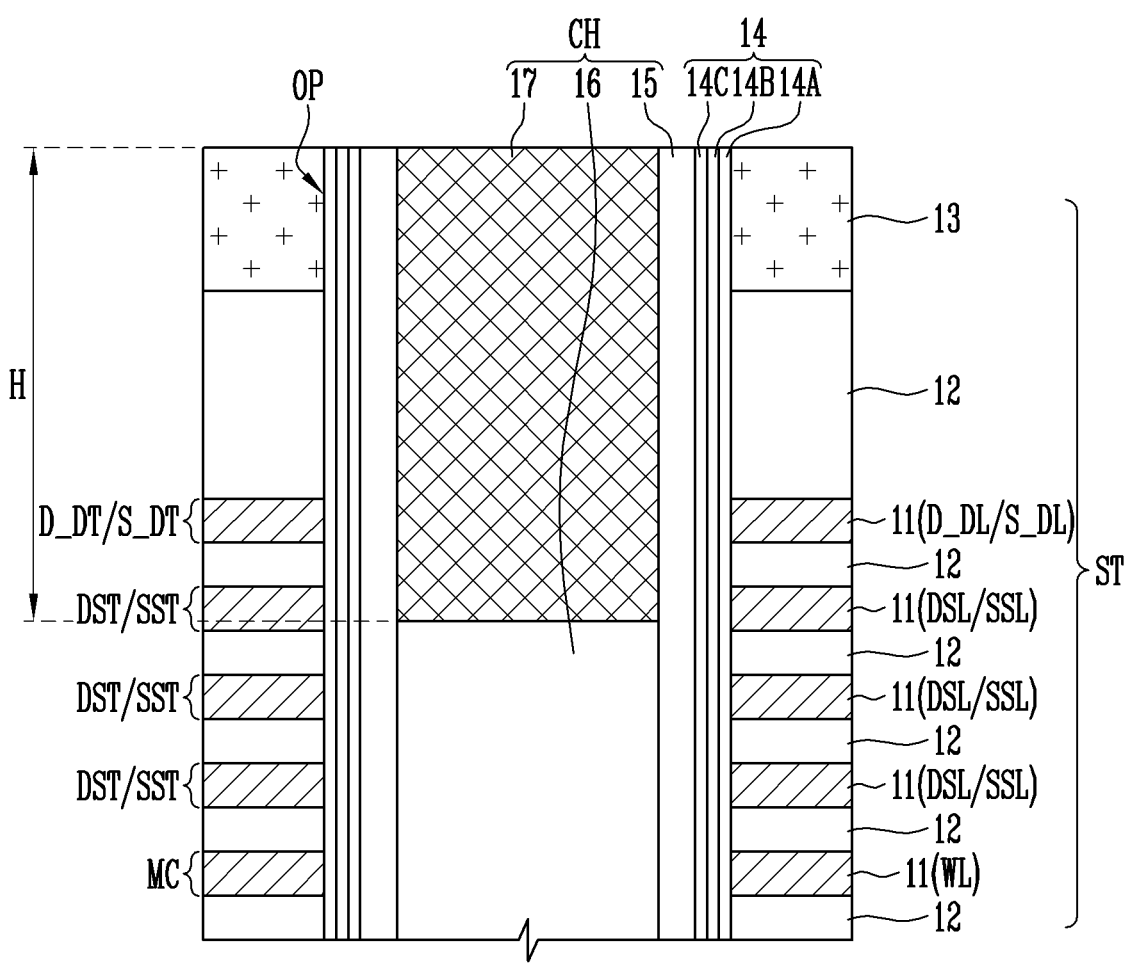
Figure 5C:
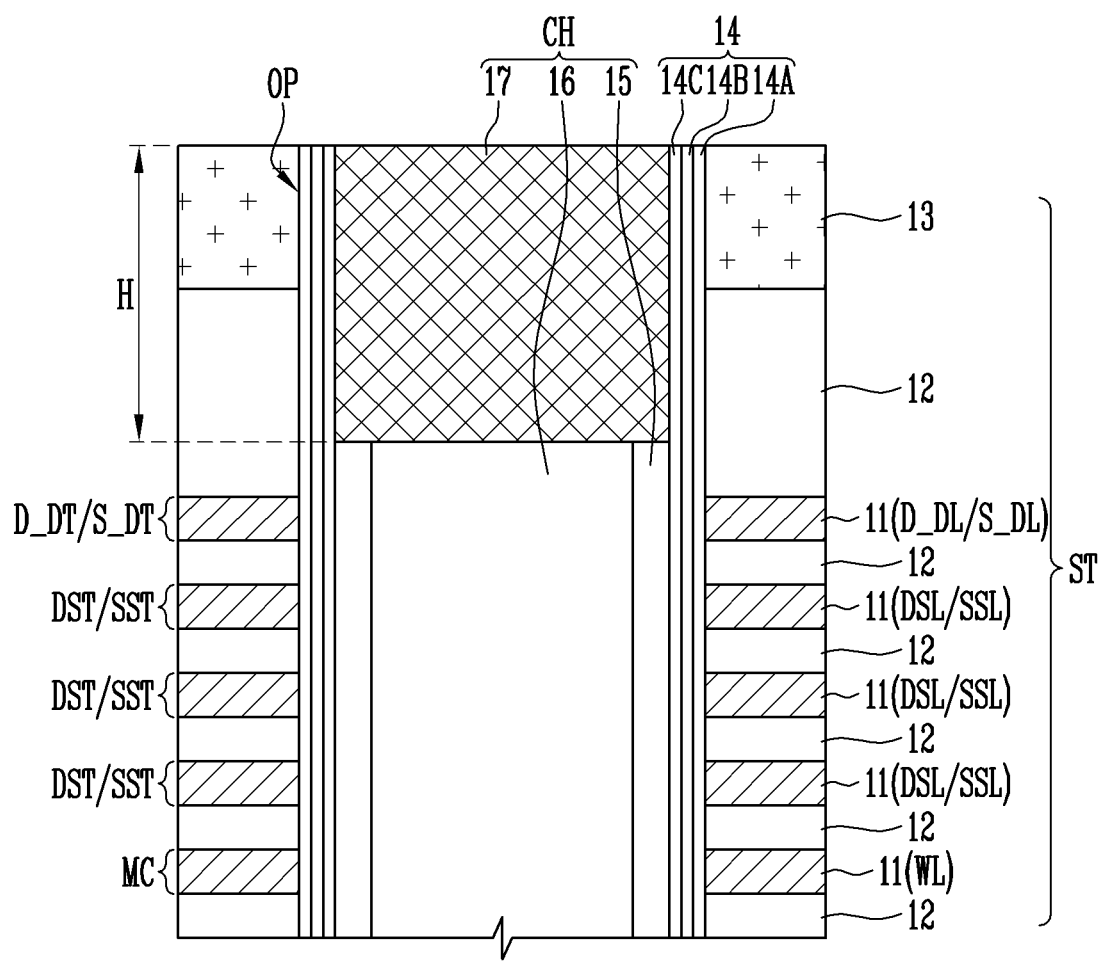

FIGS. 5A to 5C are cross-sectional diagrams illustrating the structure of a semiconductor device according to an embodiment.

Referring to FIGS. 5A to 5C, a stacked structure ST may include conductive layers 11 and insulating layers 12 alternately stacked on each other. The stacked structure ST may also include a hard mask layer 13 at the uppermost level of the stack. The hard mask layer 13 may include a nitride, carbon, and the like. In addition, the conductive layers 11 may include polysilicon, tungsten, metal, and the like.

The conductive layers 11 may be the word line WL, drain select line DSL, the source select line SSL, the drain side dummy line D_DL, or the source side dummy line S_DL. For example, at least one select line DSL/SSL may be on the word lines WL, and at least one dummy line D_DL/S_DL may be on the select line DSL/SSL.

The stacked structure ST may include openings OP extending in a stacking direction. The stacking direction may be a direction in which the conductive layers 11 and the insulating layers 12 are alternately stacked, or a vertical direction to a surface of a substrate (not illustrated).

Channel structures CH may be formed in each of the openings OP, respectively. In addition, a memory layer 14 may be interposed between the channel structure CH and the stack structure ST. The memory layers 14 may enclose a sidewall of each of channel layers 15. In addition, the memory layers 14 may include at least one of a charge blocking layer 14A, a data storage layer 14B and a tunnel insulating layer 14C. For example, the data storage layer 14B may include a floating gate, a charge trapping material, a variable resistance material, a nanostructure, and the like.

Each of the channel structures CH may include the channel layer 15, a gap-fill layer 16 and a pad 17. Each of the channel structures CH are formed in a single opening OP. The gap-fill layer 16 may be formed in the channel layer 15 so the channel layer 15 surrounds the gap fill layer 16. The gap fill layer 16 may include an insulating material.

The pad 17 may be located on the gap-fill layer 16, and each of the pad 17 and the gap-fill layer 16 may be coupled to the channel layer 15 so that the channel layer 15 surrounds the pad 17.

Referring to FIGS. 5A and 5B, the pad 17 may be formed in the space defined by the channel layer 15, and a sidewall of the pad 17 may contact an inner wall of the channel layer 15. Referring to FIG. 5C, an upper surface of the channel layer 15 and an upper surface of the gap-fill layer 16 may be located in substantially the same level, and the pad 17 may be located above the channel layer 15 and the gap-fill layer 16. According to the embodiment shown in FIG. 5C, a lower surface of the pad 17 and the upper surface of the channel layer 15 may contact each other.

The pad 17 may include a P-type impurity or an N-type impurity, having an impurity concentration higher than the channel layer 15. Furthermore, the channel layer 15 might not include an impurity or may include an impurity at a lower concentration than the pad 17. For example, the pad 17 may be a polysilicon layer doped with an N-type impurity at a high concentration, while the channel layer 15 may be an un-doped polysilicon layer or a polysilicon layer, doped with an N-type impurity at a low concentration.

Based on this structure, memory cells MC, select transistors DST/SST, and dummy transistors D_DT/S_DT, which are included in one memory string MS, share the channel structure CH. Specifically, the select transistor DST/SST may be located at an intersection of the channel layer 15 and the select line DSL/SSL, and the dummy transistor D_DT/S_DT may be located at an intersection of the channel layer 15 and the dummy line D_DL/S_DL. In other words, each of the memory strings may include the memory cells MC, at least one select transistor DST/SST, and at least one dummy transistor D_DT/S_DT stacked along the channel layer 15.

Each of the memory cells MC may include the channel layer 15, the memory layer 14, and a gate electrode. In addition, the select transistor DST/SST and the dummy transistor D_DT/S_DT may have a similar structure to the memory cell MC. In other words, the dummy transistor D_DT/S_DT may include the channel layer 15, the memory layer 14, and the gate electrode. In the dummy transistor D_DT/S_DT, the memory layer 14 may be used as a gate insulating layer.

Since the pad 17 includes an impurity having a higher concentration than the channel layer 15, the pad 17 may serve as a junction of the dummy transistor D_DT/S_DT or the select transistor DST/SST. In addition, when the impurity in the pad 17 diffuses into the channel layer 15, the region of the channel layer 15, in which the impurity diffuses, along with the pad 17, may also serve as a junction.

Accordingly, electrical characteristics of the memory string MS or the dummy transistor D_DT/S_DT may vary depending on the height H of a pad 17 or a junction overlap of the channel structure CH. The junction overlap may refer to the area in which a junction is formed in the channel structure CH. In other words, the junction overlap may basically refer to the height H of the pad, along with the region in which the impurity in the pad 17 diffuses into the channel layer 15.

Referring to FIGS. 5A and 5C, the lower surface of the pad 17 may be located in a higher level than an upper surface of the dummy line D_DL/S_DL. On the contrary, referring to FIG. 5B, the lower surface of the pad 17 may be located in a lower level than a lower surface of the dummy line D_DL/S_DL, and the pad 17 may overlap the dummy line D_DL/S_DL and the select line DSL/SSL. The channel structure CH, shown in FIG. 5B, may have a structure having a greater junction overlap and a greater pad height H than the channel structure CH shown in each of FIGS. 5A and 5C.

According to the difference in the physical structure, the memory string, corresponding to FIG. 5B, and the memory string, corresponding to each of FIGS. 5A and 5C, may have different electrical characteristics from each other. For example, when a junction overlap of the channel structure CH is greater than a reference value as shown in FIG. 5B, the dummy transistor D_DT/S_DT or the select transistor DST/SST may have a lower threshold voltage than the reference value. A leakage current may be increased during a program operation, or an excessive Gate Induced Drain Leakage (GIDL) current or a Band to band tunneling (BTBT) current may be generated during an erase operation. "A reference value" may refer to a target value at the time of design. However, due to processing limitations and other variables, the junction overlap, the threshold voltage, the height H of a pad, and the like may be different from the reference value.

Accordingly, according to an embodiment, when an erase operation, a program operation, or a read operation is performed, different levels of bias may be used depending on a threshold voltage of the dummy transistor D_DT/S_DT, the height H of the pad 17, or a junction overlap of the channel structure CH. Therefore, memory strings having different physical structures or different electrical characteristics may have uniform operational characteristics. For example, the dummy transistors D_DT/S_DT, having different physical structures or different threshold voltages, may have substantially the same operational characteristics.

In addition, according to an embodiment, the dummy transistors D_DT/S_DT may be programmed to different degrees according to difference in physical structure such as the height H of the pad 17 and the junction overlap of the channel structure CH. Accordingly, the dummy transistors D_DT/S_DT having different physical structures may have a uniform threshold voltage.

Figure 6:
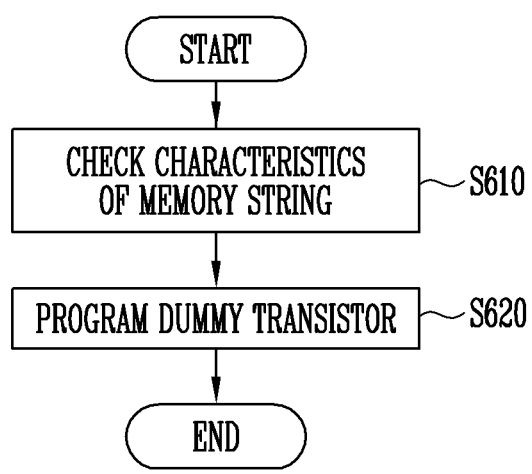
FIG. 6 is a flowchart illustrating a method of adjusting a threshold voltage of a dummy transistor of a semiconductor device according to an embodiment.
Figure 7:
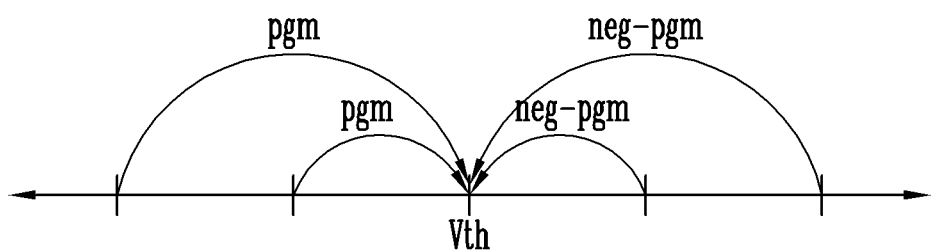
FIG. 7 is a graph illustrating a degree to which a dummy transistor is programmed.

FIG. 6 is a flowchart illustrating a method of adjusting a threshold voltage of a dummy transistor of a semiconductor device according to an embodiment. FIG. 7 is a graph illustrating a degree to a dummy transistor is programmed.

Referring to FIG. 6, step S610 includes checking the characteristics of the memory string MS. The characteristic of the memory string MS may be checked by checking the physical structure (the height of the pad 17 or the junction overlap) or the electrical characteristic (the threshold voltage) of the dummy transistor D_DT/S_DT.

After step S610, step S620 programs the dummy transistors D_DT/S_DT, included in each of the memory strings MS. Specifically, the dummy transistors D_DT/S_DT may be programmed to different degrees from each other according to characteristics of the memory strings MS. The dummy transistor D_DT/S_DT may be programmed more or programmed less according to the height of the pad 17 or the junction overlap. Thereby, the dummy transistors D_DT/S_DT having different physical structures may have a uniform threshold voltage value.

Referring to FIG. 7, the dummy transistor D_DT/S_DT may be programmed pgm or negatively programmed neg_pgm, considering the height of the pad 17, the junction overlap, or the threshold voltage of the dummy transistor D_DT/S_DT.

For example, the dummy transistor D_DT/S_DT may be programmed pgm when the height of the pad 17 or the junction overlap is greater than the reference value, or the threshold voltage of the dummy transistor D_DT/S_DT is smaller than the reference value. The dummy transistor D_DT/S_DT may be programmed more when the height of the pad 17 or the junction overlap is great. The dummy transistor D_DT/S_DT may also be programmed more as the threshold voltage decreases. In other words, the dummy transistor D_DT/S_DT may be programmed by different depths according to the height of the pad 17 or the junction overlap.

In another example, the dummy transistor D_DT/S_DT may be negatively programmed neg_pgm when the height of the pad 17 or the junction overlap is smaller than the reference value, or the threshold voltage of the dummy transistor D_DT/S_DT is greater than the reference value. The dummy transistor D_DT/S_DT may be negatively programmed neg_pgm more as the height of the pad 17 or the junction overlap decreases. The dummy transistor D_DT/S_DT may also be negatively programmed neg_pgm more when the threshold voltage is great. In other words, the dummy transistor D_DT/S_DT may be negatively programmed by different depths according to the height of the pad 17 or the junction overlap. An erase pulse may be used when the dummy transistor is negatively programmed.

Therefore, the memory strings MS, having different physical structures, may have uniform electrical characteristics. For example, the dummy transistors D_DT/S_DT, included in each of the memory strings MS, may have a uniform threshold voltage Vth.

FIGS. 8A to 8F are cross-sectional diagrams illustrating a method of manufacturing a semiconductor device according to an embodiment.

Figure 8A:
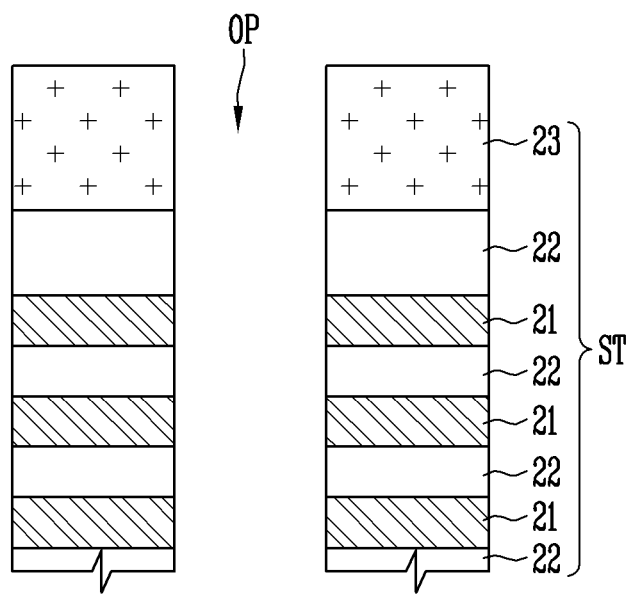
FIGS. 8A to 8F are cross-sectional diagrams illustrating a method of manufacturing a semiconductor device according to an embodiment.

Referring to FIG. 8A, a stacked structure ST may be formed. The stacked structure ST may include first material layers 21 and second material layers 22 which are alternately stacked. In addition, the stacked structure ST may include a hard mask layer 23 in the uppermost level thereof. The first material layers 21 may be provided to form gate electrodes of memory cells, select transistors, dummy transistors, and the like. Furthermore, the second material layers 22 may be provided to insulate the stacked gate electrodes from each other. The hard mask layer 23 and the first material layers 21 may include the same materials.

The first material layers 21 may include a material having high etch selectivity with respect to the second material layers 22. For example, each of the first material layers 21 may be a sacrificial layer including a nitride and each of the second material layers 22 may be an insulating layer including an oxide. Alternatively, the first material layers 21 may be conductive layers including polysilicon, tungsten, or the like, and the second material layers 22 may be insulating layers including an oxide or the like. In another example, each of the first material layers 21 may be a conductive layer including doped polysilicon, and each of the second material layers 22 may be a sacrificial layer including un-doped polysilicon.

Subsequently, the openings OP are formed by penetrating the stack structure. A width of each of the openings OP may be uniform throughout the opening OP or each of the openings OP may have a width that decreases from the upper portion toward the lower portion thereof.

Figure 8B:
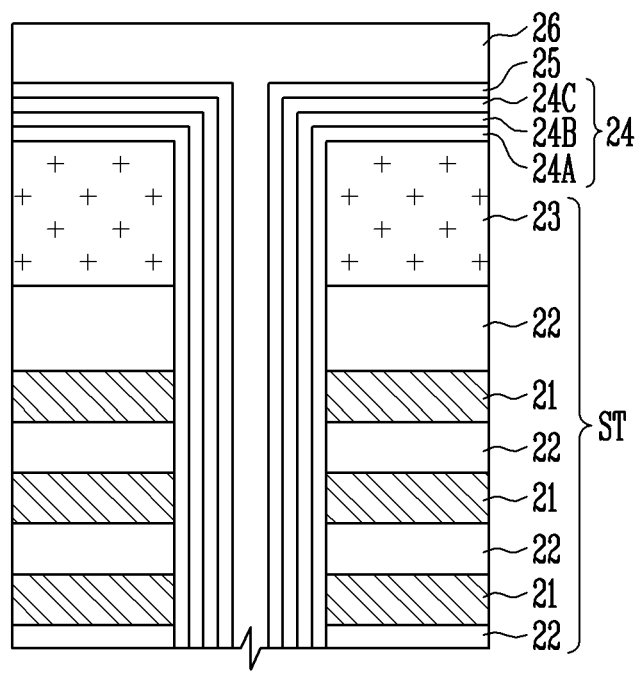

Referring to FIG. 8B, a memory layer 24 may be formed in each of the openings OP. Specifically, the memory layer 24 may be formed to be in contact with the surface of the opening OP, conforming to the shape of the opening OP. The memory layer 24 may also be formed on the upper surface of the stack structure ST. In an embodiment, a charge blocking layer 24A, a data storage layer 24B, and a tunnel insulating layer 24C may be sequentially formed.

Subsequently, a channel layer 25 may be formed on the surface of the memory layer 24, including the upper surface of the stack structure, in the opening OP.

Subsequently, a gap-fill layer 26 may be formed on the surface of the channel layer 25, including the upper surface of the stack structure, in the opening OP. The gap-fill layer 26 may completely fill the each of the openings OP. Although not illustrated in FIG. 8B, the gap-fill layer 26 may include a void therein.

Figure 8C:
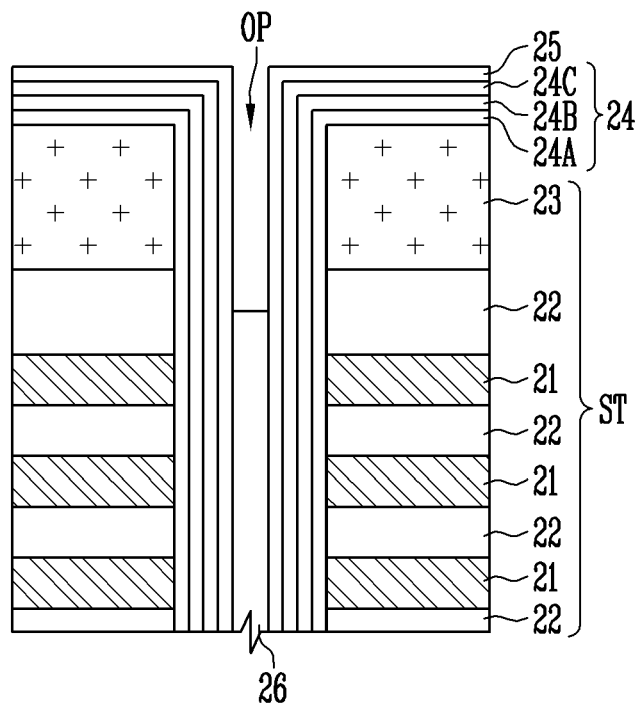

Referring to FIG. 8C, the gap-fill layer 26 may be etched, thereby re-opening a portion of the opening OP. The channel layer 25 may be etched along with the gap fill layer 26 in another embodiment. An upper surface of the e gap fill layer 26 and an upper surface of the channel layer 25 may be substantially located at the same level.

The depth, to which the gap fill layer 26 is etched, determines the height of the pad. The re-opened region of the opening OP is a region in which a pad is to be formed in a subsequent process. A pad may be formed at a region of the opening OP which is opened again during a subsequent process. Accordingly, a height of the pad may be determined according to a depth to which the gap-fill layer 26 is etched. The channel layer 25 may also be etched when the gap-fill layer 26 is etched. According to the embodiment shown in FIG. 8C, an upper surface of the gap-fill layer 26 and an upper surface of the channel layer 25 may be located in substantially the same level.

Figure 8D:
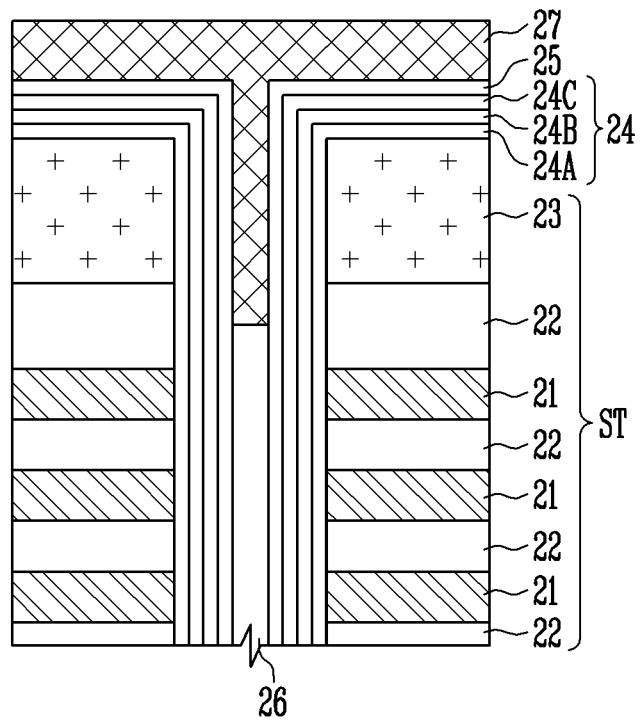

Referring to FIG. 8D, a pad layer 27 may be formed in the opening OP and on the channel layer 25 on the upper surface of the stacked structure ST. The pad layer 27 may be doped with an impurity, using an in-situ method, while in the process of being formed or after its formation.

Figure 8E:
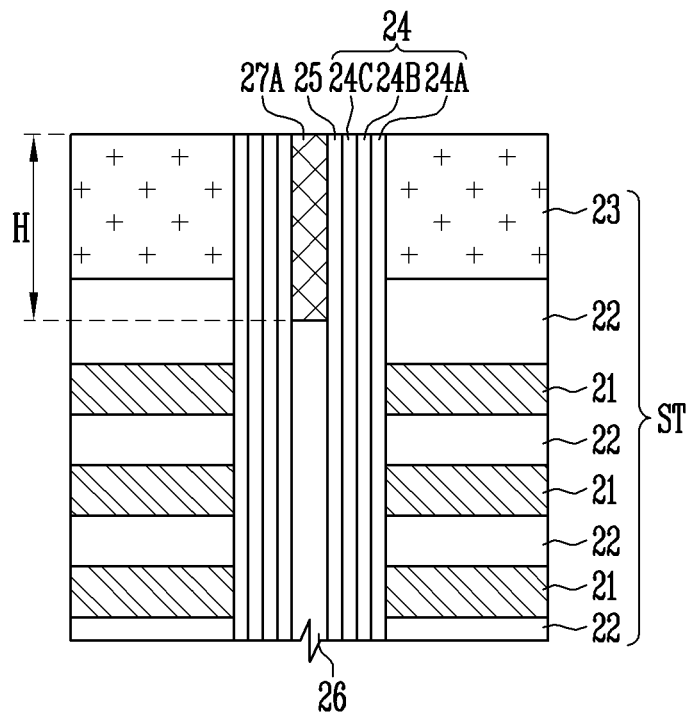

Referring to FIG. 8E, the pad layer 27, the channel layer 25, and the memory layer 24 may be planarized until the upper surface of the stacked structure ST is exposed. For example, a planarizing process may be performed by a Chemical Mechanical Polishing (CMP) process. After planarization, a pad 27A may be formed.

Figure 8F:
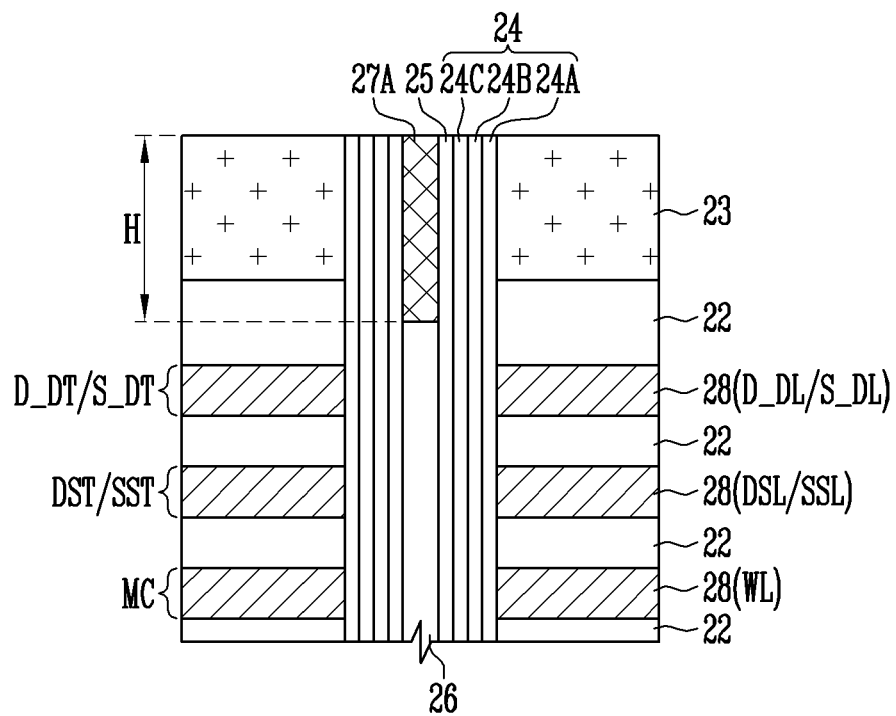

Referring to FIG. 8F, either the first material layers 21 or the second material layers 22 may be replaced by third material layers 28. For example, when the first material layers 21 are sacrificial layers and the second material layers 22 are insulating layers, the third material layers 28 may be conductive layers. In another example, when the first material layers 21 are conductive layers and the second material layers 22 are insulating layers, the third material layers 28 may be silicide layers. In another example, when the first material layers 21 are conductive layers and the second material layers 22 are sacrificial layers, the second material layers 22 may be replaced by insulating layers.

Accordingly, the memory cells MC, at least one select transistor DST/SST, and at least one dummy transistor D_DT/S_DT, stacked along the channel layer 25, may be formed.

The height of the each of the pads 27A and the junction overlap may be different from the reference value or might not be uniform due to limitations of a manufacturing process. Accordingly, characteristics of the memory strings MS may be checked, and a correct operation may be performed according to the characteristics. For example, checking the characteristics and correcting may be performed when testing a wafer.

First, physical or electrical characteristics of the memory strings MS may be checked.

For example, an amount of current during a read operation may be measured, such that a height of the pad 27A or a junction overlap may be estimated. Variations in current, according to variations in level of bias applied to the dummy line D_DL/S_DL, may be measured. Referring to Table 1, a bit line voltage (Vbl) may be applied to the bit line BL, a pass voltage (Vpass) may be applied to the word line WL, a turn-on voltage (for example, a voltage of 4.5V) may be applied to the drain select line DSL and the source select line SSL, and a ground voltage (0V) may be applied to the source line SL. In addition, an amount of current may be measured while the voltage applied to the drain side dummy line D_DL is split into 4V/5V/6V/7V/8V.

TABLE 1

| Bit line BL | Vbl (0.5 V) |
|---|---|
| Drain side dummy line D_DL | Split (4 V/5 V/6 V/7V G/8 V) |
| Drain select line DSL | Von (4.5 V) |
| Word line WL | Vpass (7 V) |
| Source select line SSL | Von (4.5 V) |
| Source line SL | 0 V |

Specifically, the drain-side dummy transistor D_DT is turned on or turned off based on the bias voltage levels (4V/5V/6V/7V/8V), and based on the turning on and turning off of the drain-side dummy transistor D_DT, the amount of current changes. Therefore, the amount of current flow helps to determine at which bias voltage level the drain-side dummy transistor D_DT is turned on, thereby being able to estimate the height of the pad 17 or the junction overlap. Specifically, when a lower bias voltage level turns on the drain-side dummy transistor D_DT, the pad height and junction overlap is greater than a reference value. Accordingly, when only a higher bias voltage level turns on the drain-side dummy transistor D_DT, the pad height and junction overlap is smaller than the reference value.

Although an example in which the memory string includes the drain side dummy transistor D_DT is shown in Table 1, it may also be applied to an example in which the memory string includes the source side dummy transistor S_DT. To measure characteristics of the source side dummy transistor S_DT, an amount of current may be measured while a turn-on voltage (for example, a voltage of 4.5V) is applied to the source select line SSL and a voltage applied to the source side dummy line S_DL is changed to 7V/8V/9V/10V.

In another example, which has similar conditions shown in Table 1, a reference voltage (for example, a voltage of 7V) may be applied to the drain side dummy line D_DL, and an amount of current flowing may be compared to a reference value. It may be determined that the height of the pad 27A or the junction overlap is small when the amount of current is smaller than the reference value. It may be determined that the height of the pad 27A or the junction overlap is great when the amount of current is greater than the reference value. The reference value may be an amount of current flowing when the reference voltage (for example, a voltage of 7V) is applied to the drain side dummy line D_DL, if the height of the pad 27A or the junction overlap corresponds to a target value at the time of design.

Although an example in which the memory string includes the drain side dummy transistor D_DT is shown in Table 1, it may also be applied to an example in which the memory string includes the source side dummy transistor S_DT. To measure characteristics of the source side dummy transistor S_DT, an amount of current flowing may be compared to a reference value when a reference voltage (for example, a voltage of 7V) is applied to the source side dummy line S_DL.

In another example, the height of the pad 27A or the junction overlap may be estimated by measuring threshold voltages of the dummy transistor D_DT/S_DT and the select transistor DST/SST adjacent thereto. Table 2 shows an example in which a threshold voltage of each of the drain side dummy transistor D_DT and the drain select transistors DST0, DST1, and DST2 is measured when a single memory string includes three drain select transistors DST0, DST1, and DST2 and one drain side dummy transistor D_DT, and the drain select transistors DST0, DST1, and DST2 and the drain side dummy transistor D_DT are sequentially stacked.

TABLE 2

|      | Threshold voltage |
|------|-------------------|
| D_DT | −2 V              |
| DST2 | −0.1 V            |
| DST1 | 0 V               |
| DST0 | 0.2 V             |

A variation in threshold voltage between the drain side dummy transistor D_DT and the drain select transistors DST0, DST1, and DST2 may be checked according to the measured values. According to the manufacturing process described above, the drain side dummy transistor D_DT and the drain select transistors DST0, DST1, and DST2 may have substantially the same structure, but may have different junctions, respectively. In other words, the threshold voltage of each of the transistors may vary according to the height of the pad 27A or the junction overlap of the channel structure. For example, when the height of the pad 27A or the junction overlap is great, the threshold voltage of the transistor may be low. Accordingly, the height of the pad 27A or the junction overlap may be estimated by analyzing a tendency of variations in threshold voltage of each of the transistors D_DT, DST0, DST1, and DST2 by inversely estimating the values.

For example, it is assumed that the reference value of the threshold voltage is 0V. Based on this assumption, the threshold voltage of the drain-side dummy transistor D_DT, of −2V, is lower than the reference value of 0V. Therefore, it may be determined that the height of the pad 17 or the junction overlap is greater than a reference value and will remain a dummy transistor. Furthermore, since the drain select transistors DST0 and DST1 have a threshold voltage of −0.1V and 0V, respectively, it may be determined that the pad 17 or the junction overlap is formed to a depth corresponding to the drain select transistor DST1. Therefore, based on Table 5 and the assumption that the reference value is 0V, the number of the drain-side dummy transistor D_DT is adjusted so that D_DT, DST2, and DST1 are set as dummy transistors.

The height of the pad 27A or the junction overlap may be estimated by combining the embodiments described above.

Subsequently, a bias level of an erase operation, a program operation, or a read operation may be adjusted using the estimated height of the pad 27A or the estimated junction overlap. The bias level may be adjusted by the method described with reference to FIG. 6. For example, bias applied to the dummy line D_DL/S_DL may be adjusted to be low when the height of the pad 27A or the junction overlap is great, and bias applied to the dummy line D_DL/S_DL may be adjusted to be great when the height of the pad 27A or the junction overlap is small. Subsequently, the adjusted bias value may be stored in a fuse circuit, a memory cell, and the like.

Alternatively, the dummy transistors D_DT/S_DT may be programmed to different degrees by using the estimated height of the pad 27A or the estimated junction overlap. The dummy transistors D_DT/S_DT may be programmed by the method described with reference to FIGS. 6 and 7. For example, the dummy transistors D_DT/S_DT may be programmed to increase the threshold voltage thereof when the height of the pad 27A or the junction overlap is greater than the reference value. In addition, the dummy transistors D_DT/S_DT may be negatively programmed to decrease the threshold voltage thereof when the height of the pad 27A or the junction overlap is smaller than the reference value.

The height of the pad 27A or the junction overlap may be estimated again after the bias is adjusted. The bias may then be adjusted again according to a result of conjecture. For example, the bias may be adjusted by a method of measuring a current, and may then be adjusted again by a method of measuring a threshold voltage.

According to the manufacturing method as described above, a semiconductor device having uniform operational characteristics may be provided by a correct operation even when the memory strings MS have different pads 27A or junction overlaps from each other.

Figure 9:
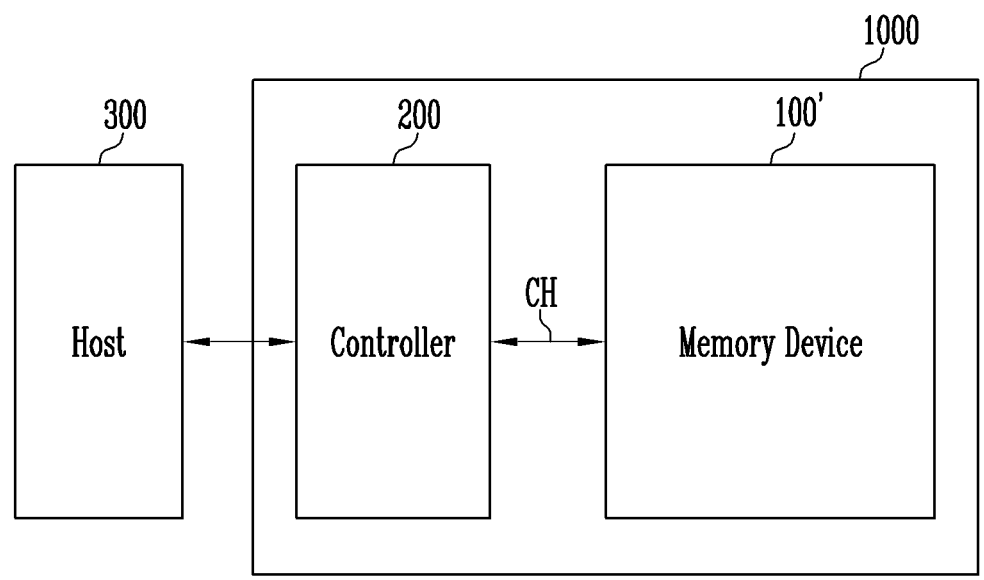
FIG. 9 is a block diagram illustrating the configuration of a memory system according to an embodiment.

FIG. 9 is a block diagram illustrating the configuration of a memory system 1000 according to an embodiment. Referring to FIG. 9, the memory system 1000 may include a memory device 100' and a controller 200.

The controller 200 may control the memory device 100' through a channel CH and the memory device 100' may operate in response to control of the controller 200. The memory device 100' may include a memory cell array including a plurality of memory blocks. According to an embodiment, the memory device 100' may be the semiconductor device 100 described above, or a flash memory device.

The controller 200 may control the memory device 100' in response to a request from a host 300. In addition, the memory device 100' may receive a command and an address from the controller 200 through the channel CH and access an area selected from the memory cell array in response to the address. In other words, the memory device 100' may perform an internal operation corresponding to a command on the area selected by the address.

In addition, the controller 200 may control the memory device 100' to perform a program operation, a read operation, or an erase operation. During the program operation, the controller 200 may provide a program command, an address, and data to the memory device 100' through the channel CH, and the memory device 100' may program the area selected by the address with data. During the erase operation, the controller 200 may provide an erase command and an address to the memory device 100' through the channel CH, and the memory device 100' may erase data stored in the area selected by the address. During the read operation, the controller 200 may provide a read command and an address to the memory device 100' through the channel CH and the memory device 100' may read data from the area selected by the address. This read operation may include a read operation serving as verification entailed by a program or erase operation as well as a read operation performed to read and output data stored in a memory cell.

Figure 10:
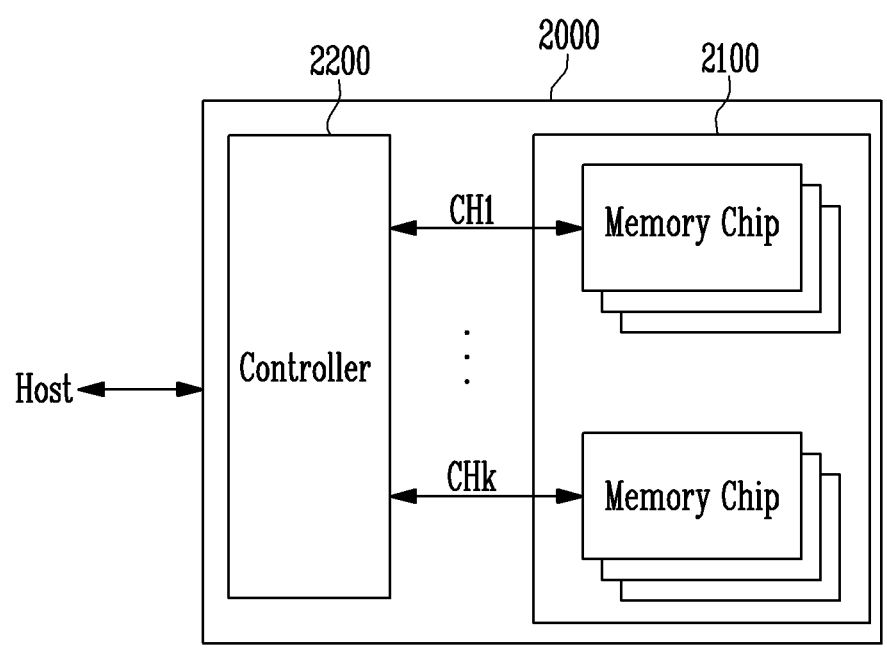
FIG. 10 is a block diagram illustrating the configuration of a memory system according to an embodiment.

FIG. 10 is a block diagram illustrating the configuration of a memory system 2000 according to an embodiment. Referring to FIG. 10, the memory system 2000 may include a memory device 2100 and a controller 2200.

The memory device 2100 may be a semiconductor device and include a plurality of memory chips. The plurality of memory chips may be divided into a plurality of groups. The plurality of groups may communicate with the controller 2200 through first to kth channels CH1 to CHk, respectively. Each of the memory chips may be configured and operated in a similar manner to the semiconductor device 100 described above with reference to FIG. 1.

Each group may be configured to communicate with the controller 2200 through a single common channel. The controller 2200 may be configured in substantially the same manner as the controller 200 described above with reference to FIG. 9, and configured to control the plurality of memory chips of the memory device 2100 through the plurality of channels CH1 to CHk. The memory system 2000 may be modified so that a single memory chip may be coupled to a single channel.

The controller 2200 and the memory device 2100 may be integrated into a single semiconductor device. According to an embodiment, the controller 2200 and the memory device 2100 may be integrated into a single semiconductor device to form a memory card. For example, the controller 2200 and the memory device 2100 may be integrated into a single semiconductor device and form a memory card such as a personal computer memory card international association (PCMCIA), a compact flash card (CF), a smart media card (SM or SMC), a memory stick, a multimedia card (MMC, RS-MMC, or MMCmicro), an SD card (SD, miniSD, microSD, or SDHC), a universal flash storage (UFS), and the like.

The controller 2200 and the memory device 2100 may be integrated into a single semiconductor device to form a Solid State Drive (SSD). The SSD may include a storage device for storing data in a memory. When the memory system 2000 serves as an SSD, operational rates of the host Host coupled to the memory system 2000 may be significantly improved.

In another example, the memory system 2000 may be provided as one of various elements of an electronic device such as a computer, an Ultra Mobile PC (UMPC), a workstation, a net-book, Personal Digital Assistants (PDAs), a portable computer, a web tablet, a wireless phone, a mobile phone, a smartphone, an e-book, a portable multimedia player (PMP), a game console, a navigation device, a black box, a digital camera, a 3-dimensional television, a digital audio recorder, a digital audio player, a digital picture recorder, a digital picture player, a digital video recorder, a digital video player, a device capable of transmitting/receiving information in an wireless environment, one of various devices for forming a home network, one of various electronic devices for forming a computer network, one of various electronic devices for forming a telematics network, an RFID device, one of various elements for forming a computing system, or the like.

Figure 11:
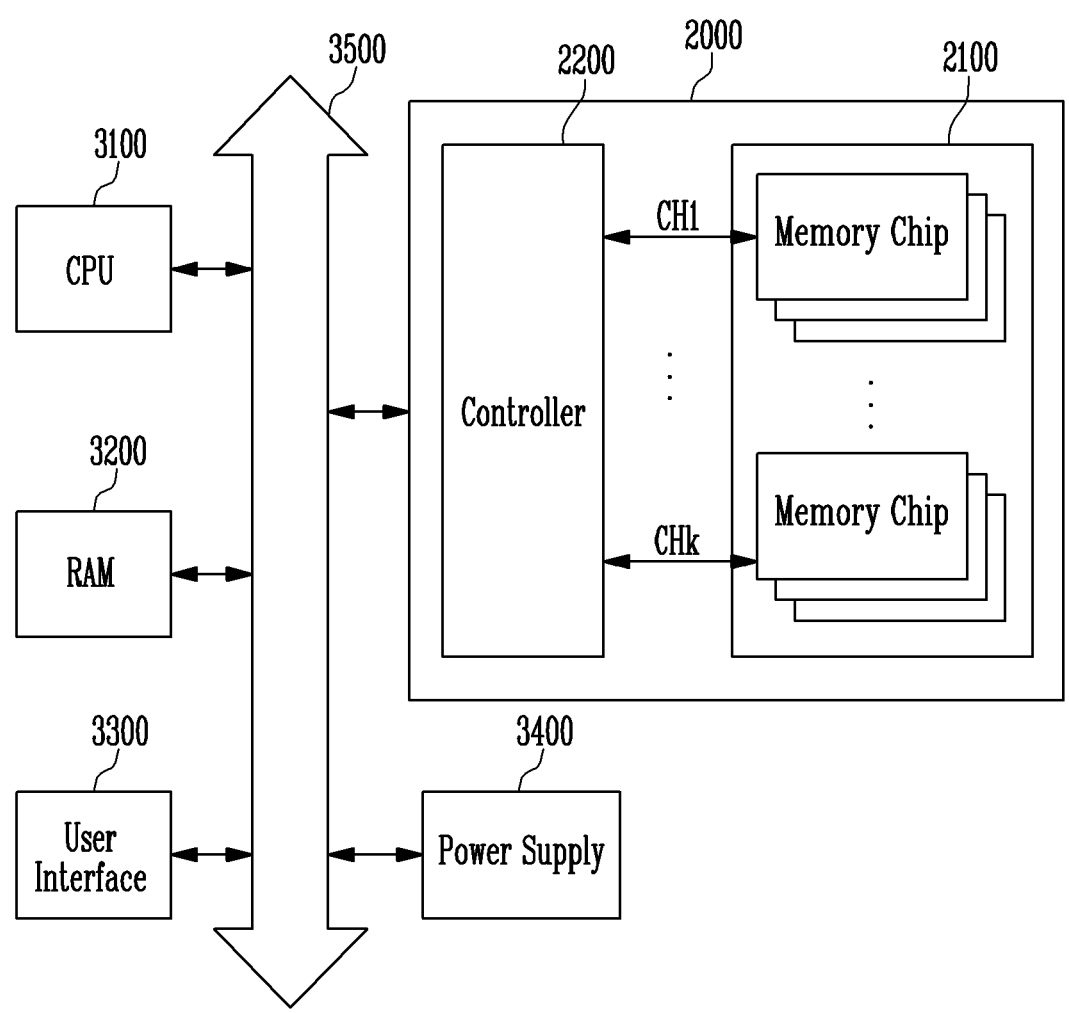
FIG. 11 is a block diagram illustrating the configuration of a computing system according to an embodiment.

FIG. 11 is a block diagram illustrating the configuration of a computing system 3000 according to an embodiment. Referring to FIG. 11, the computing system 3000 may include a central processing unit 3100, a Random Access Memory (RAM) 3200, a user interface 3300, a power supply 3400, a system bus 3500, and the memory system 2000.

The memory system 2000 may be electrically coupled to the central processing unit 3100, the RAM 3200, the user interface 3300, and the power supply 3400 through the system bus 3500. Data provided through the user interface 3300 or data processed by the central processing unit 3100 may be stored in the memory system 2000.

The memory device 2100 may be coupled to the system bus 3500 through the controller 2200, or directly coupled to the system bus 3500. When the memory device 2100 is directly coupled to the system bus 3500, functions of the controller 2200 may be performed by the central processing unit 3100 and the RAM 3200.

The computing system 3000 may include the memory system 2000 described with reference to FIG. 10 or the memory system 1000 described with reference to FIG. 9. In addition, the computing system 3000 may include both of the memory systems 1000 and 2000 described above with reference to FIGS. 9 and 10.

According to embodiments, a semiconductor device having improved operational characteristics and reliability and a manufacturing method of the semiconductor device may be provided.

Examples of embodiments have been disclosed herein, and although specific terms are employed, various changes in forms and details may be made to the above-described examples of embodiments without departing from the spirit and scope of the present invention. Accordingly, it will be understood by those skilled in the art that the scope of the present invention should not be limited to the above-described examples of embodiments, and may cover the scope of the following claims and their equivalents.

What is claimed is:

1. A semiconductor device, comprising:
a memory block including a plurality of memory strings, each of the plurality of memory strings including one or more dummy transistors;
wherein dummy transistors included in different memory strings are programmed using different levels of program voltages according to a junction overlap of each of the memory strings.

2. The semiconductor device of claim 1, wherein each of the plurality of memory strings includes at least one drain select transistor, a plurality of memory cells, at least one source select transistor, and the dummy transistor, and
wherein the dummy transistors are coupled between a bit line and the drain select transistor or between a source line and the source select transistor.

3. The semiconductor device of claim 1, wherein each of the plurality of memory strings includes a channel structure, including a junction, and the junction overlap refers to a range in which the junction is formed in the channel structure.

4. The semiconductor device of claim 1, wherein a dummy transistor having the junction overlap smaller than a reference value, among the dummy transistors, is negatively programmed.

5. The semiconductor device of claim 4, wherein a dummy transistor having a smaller junction overlap is negatively programmed more.

6. The semiconductor device of claim 1, wherein a dummy transistor having the junction overlap greater than a reference value, among the dummy transistors, is programmed.

7. The semiconductor device of claim 6, wherein a dummy transistor having a greater junction overlap is programmed more.

8. The semiconductor device of claim 1, wherein each of the plurality of memory strings includes at least one drain select transistor, a plurality of memory cells, at least one source select transistor, and the dummy transistor,
wherein the dummy transistors are coupled between a bit line and the drain select transistor.

9. A semiconductor device, comprising:
a memory block including a first memory string including a first dummy transistor and a second memory string including a second dummy transistor, wherein the first dummy transistor has a first junction overlap smaller than a reference value, and the second dummy transistor has a second junction overlap different from the first junction overlap, and wherein the first dummy transistor is negatively programmed and the second dummy transistor is negatively programmed more than the first dummy transistor.

10. The semiconductor device of claim 9, wherein the second junction overlap is smaller than the first junction overlap.

11. The semiconductor device of claim 9, wherein the first dummy transistor and the second dummy transistor have substantially a same threshold voltage.

12. A semiconductor device, comprising:
a memory block including a first memory string including a first dummy transistor and a second memory string including a second dummy transistor,
wherein the first dummy transistor has a first junction overlap greater than a reference value, and the second dummy transistor has a second junction overlap different from the first junction overlap, and
wherein the first dummy transistor is programmed and the second dummy transistor is programmed more than the first dummy transistor.

13. The semiconductor device of claim 12, wherein the second junction overlap is greater than the first junction overlap.

14. The semiconductor device of claim 12, wherein the first dummy transistor and the second dummy transistor have substantially a same threshold voltage.

* * * * *